United States Patent [19]

Welch et al.

[11] Patent Number: 5,777,854

[45] Date of Patent: Jul. 7, 1998

[54] INTEGRATE FLEXIBLE CONTACTS GROUNDING SYSTEM FOR A COMPUTER SYSTEM CHASSIS

[75] Inventors: Randall S. Welch, Lake Forest; Bao Gia Le, Orange, both of Calif.

[73] Assignee: AST Research, Inc., Irvine, Calif.

[21] Appl. No.: 866,397

[22] Filed: May 30, 1997

Related U.S. Application Data

[63] Continuation of Ser. No. 445,430, May 19, 1995, abandoned.

[51] Int. Cl.$^6$ ...................................................... H05K 7/14
[52] U.S. Cl. ...................... 361/800; 364/818; 364/224; 364/816; 364/752; 174/35 R; 174/35 GC; 435/88; 435/109; 435/609; 435/608
[58] Field of Search .................................. 361/728, 736, 361/738, 752, 753, 757, 800, 816, 818, 820, 821, 212, 220, 744, 784, 790; 174/35 R, 35 GC, 50, 52.1, 51; 439/88, 108, 109, 607–610; 257/678, 659, 660; 307/89, 90; 220/402; 206/275

[56] References Cited

U.S. PATENT DOCUMENTS

| | | | |
|---|---|---|---|
| 4,115,655 | 9/1978 | Prentice | 174/35 R |
| 4,322,572 | 3/1982 | Snyder | 174/35 R |
| 5,014,160 | 5/1991 | McCoy, Jr. | 361/818 |
| 5,278,351 | 1/1994 | Herrick | 174/35 R |
| 5,354,951 | 10/1994 | Lange, Sr. et al. | 174/35 R |

*Primary Examiner*—Leo P. Picard
*Assistant Examiner*—Anthony Dinkins
*Attorney, Agent, or Firm*—Knobbe, Martens, Olson & Bear, L.L.P.

[57] ABSTRACT

A computer system chassis, including a base and a cover, implements an improved grounding system by integrally forming a plurality of flexible protruding contacts into predetermined contact regions throughout the base during the metal punching manufacturing phase of the chassis base blank. In this way, when the base and cover are attached to each other, the size of any gaps which may form in these contact regions, as a result of warpage or design tolerances, are reduced. This is due to the number of mechanical contacts being made by the plurality of flexible contacts which protrude and extend across these gaps and connect the base to the cover. In addition to reducing the size of these gaps, the flexible contacts provide an improved electrical grounding to the cover by increasing metal-to-metal contact between the cover and the base, both of which reduce EMI emissions from the computer system chassis.

19 Claims, 3 Drawing Sheets

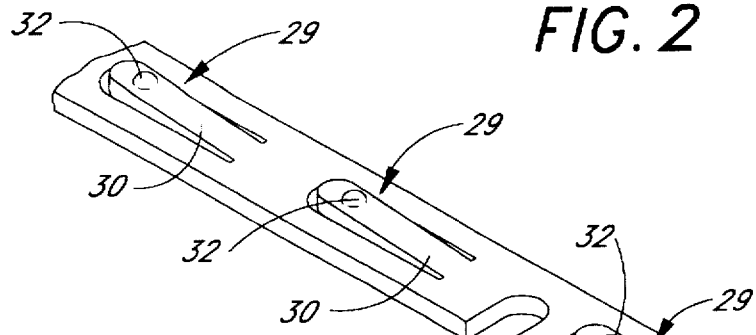
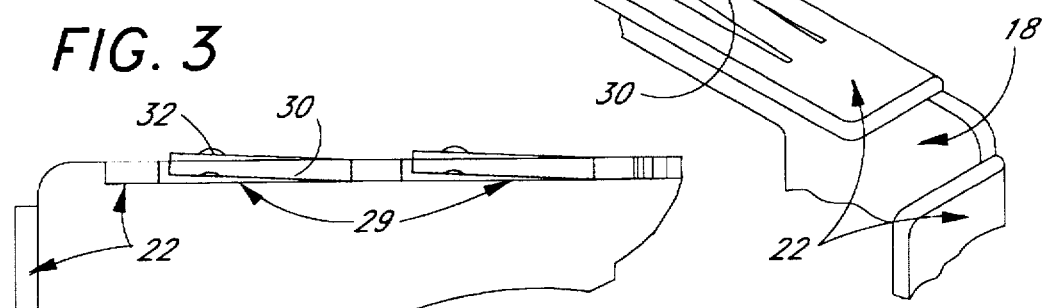
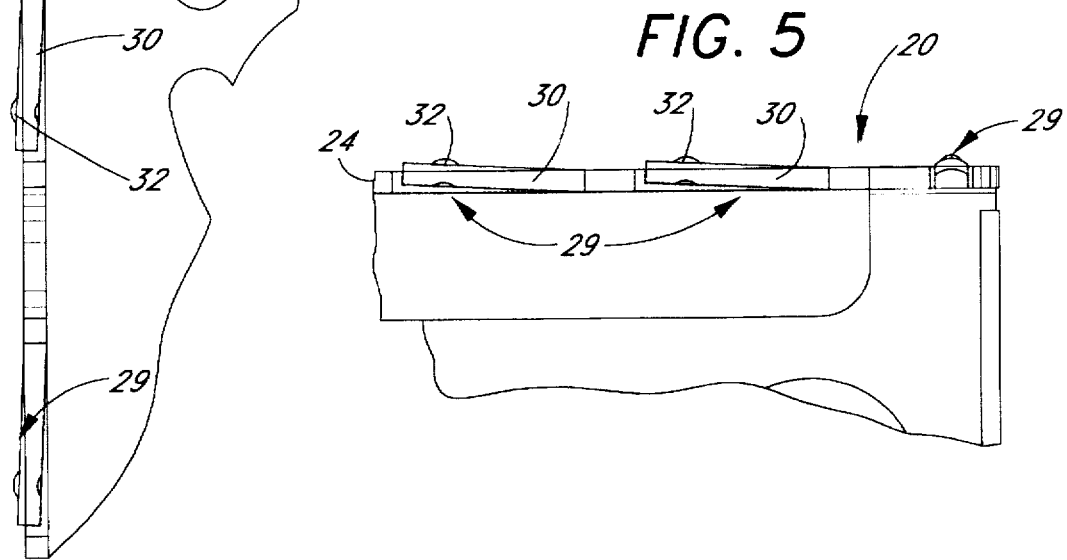

INTEGRATE FLEXIBLE CONTACTS GROUNDING SYSTEM FOR A COMPUTER SYSTEM CHASSIS

This application is a continuation of U.S. patent application Ser. No. 08/445,430, filed May 19, 1995 now abandoned.

FIELD OF THE INVENTION

This invention relates to a grounding system for a chassis used for housing electronic devices, and more specifically to a grounding system for a computer system chassis comprising integrated flexible contacts for reducing Electromagnetic Interference (EMI) emissions from the computer system chassis.

BACKGROUND OF THE INVENTION

Manufacturers of electronic devices must conform to certain Federal Communications Commission's (FCC) rules and regulations regarding the acceptable amount of EMI emissions from electronic devices. The FCC imposes limits on the amounts of EMI emissions allowed to be released from devices being sold and transported in and around the United States.

With the implementation of each new generation of computer processor and specialized internal circuitry, the amount of EMI emissions generated by these new electronic devices have continued to increase. Therefore, computer manufacturers are constantly trying to improve the grounding on the computer system chassis used to house these devices in order to minimize the EMI emissions from the computer system chassis. Improving the grounding of the chassis also provides additional protection against electrostatic discharge, which can damage computer system circuitry if contact with a poorly grounded chassis results in electrostatic discharge.

In a typical computer system, the computer system chassis comprises a base and a mating cover. The cover is removable from the base, thereby allowing an end user to maintain and upgrade the computer system and its associated internal circuitry. However, if the cover is not properly mated to the base once the cover is attached to the base, then gaps will form between the cover and the base around a perimeter of contact region between the cover and the base. As is known in the art, the existence of these gaps allows for increased EMI emissions from the computer system chassis. Basically, with a loose-fitting cover, the cover is driven by the EMI emissions and acts like an antenna. By providing greater contact from the cover to the base which is properly grounded, the antenna effect of the cover is reduced.

Previously, such gaps, or improper fittings, did not cause problems since the amount of EMI emissions being generated was not significant. However, with today's advanced circuitry, this is no longer true. Therefore, in order to reduce EMI emissions, computer manufacturers have attempted to increase the metal-to-metal contact between the base and the cover and to reduce the size of the gaps that occur between the base and the cover along the perimeter of contact region, thereby providing a better electrical grounding between the cover and the base.

A prior art solution to EMI emissions has been to attach one or more add-on contacts to the perimeter of contact region around the base in one or more localized areas in order to increase metal-to-metal contact between the base and the cover and to reduce the size of the gaps that form between the base and the cover. However, individually installing such contacts by hand onto the chassis base increases costs by requiring additional add-on parts, and is both time consuming and labor intensive to install.

Therefore, a better solution is needed to increase metal-to-metal contact between the base and cover, and to reduce the size of gaps occurring between the base and cover, thereby providing a better electrical grounding between the base and cover, which reduces EMI emissions from the computer system chassis without increasing the cost of parts and labor.

SUMMARY OF THE INVENTION

The computer system chassis grounding system of the present invention comprises integrated flexible contacts for reducing EMI emissions from a computer system chassis by providing an improved electrical grounding system that increases contact between, and reduces the size of gaps between, the base and cover without increasing the cost of parts and labor.

The grounding system of the present invention comprises a plurality of integrated flexible contacts which, in a preferred embodiment, are integrally formed throughout portions of the base that are referred to as contact regions. The flexible contacts are formed by punching out portions of a chassis base blank during the manufacturing process to form flexible contacts comprising a protrusion arm having a dimple. In this way, the size of any potential gaps which may form between the base and cover due to design tolerances are minimized by the placement of these flexible contacts, which provide additional points of contact between the base and the cover. The dimple provides the actual contact point on the protrusion arm between the computer system chassis base and cover. If design tolerances are very small, the protrusion arm can be kept flush with the base plane, since the dimple will provide enough of a protrusion to extend across a slim gap formed in a chassis having a small design tolerance.

It is to be understood that the flexible contacts may be formed in various ways, other than by punching out portions of the base blank. For example, if the shape of the base blank is formed by a mold, then the mold can be designed to produce the flexible contacts without the need for punching out portions of the base blank after the molding process.

One of the benefits of the present invention is that the computer system chassis grounding system of the present invention does not require any add-on contacts. Thus, cost savings are realized by reducing the parts count and by reducing labor costs required for manual installation.

Accordingly, it is an object of the present invention to provide an improved grounding system for a chassis used for housing electronic devices.

It is a further object of the present invention to provide an improved grounding system for a computer system chassis.

An additional object of the present invention is to provide an improved computer system chassis grounding system comprising integrated flexible contacts.

Another object of the present invention is to provide a chassis grounding system that increases metal-to-metal contact between the base and the cover, thereby reducing EMI emissions from the computer system chassis.

Further objects and advantages of the present invention will become apparent from a consideration of the drawings and ensuing description.

BRIEF DESCRIPTION OF THE DRAWINGS

FIG. 2 is an enlarged perspective view of a portion of FIG. 1 showing the details of a plurality of flexible contacts.

FIG. 3 is a partial front view of a front face of the base.

FIG. 5 is a partial top view of the rear face of the base.

DETAILED DESCRIPTION OF A PREFERRED EMBODIMENT

Figure 1:
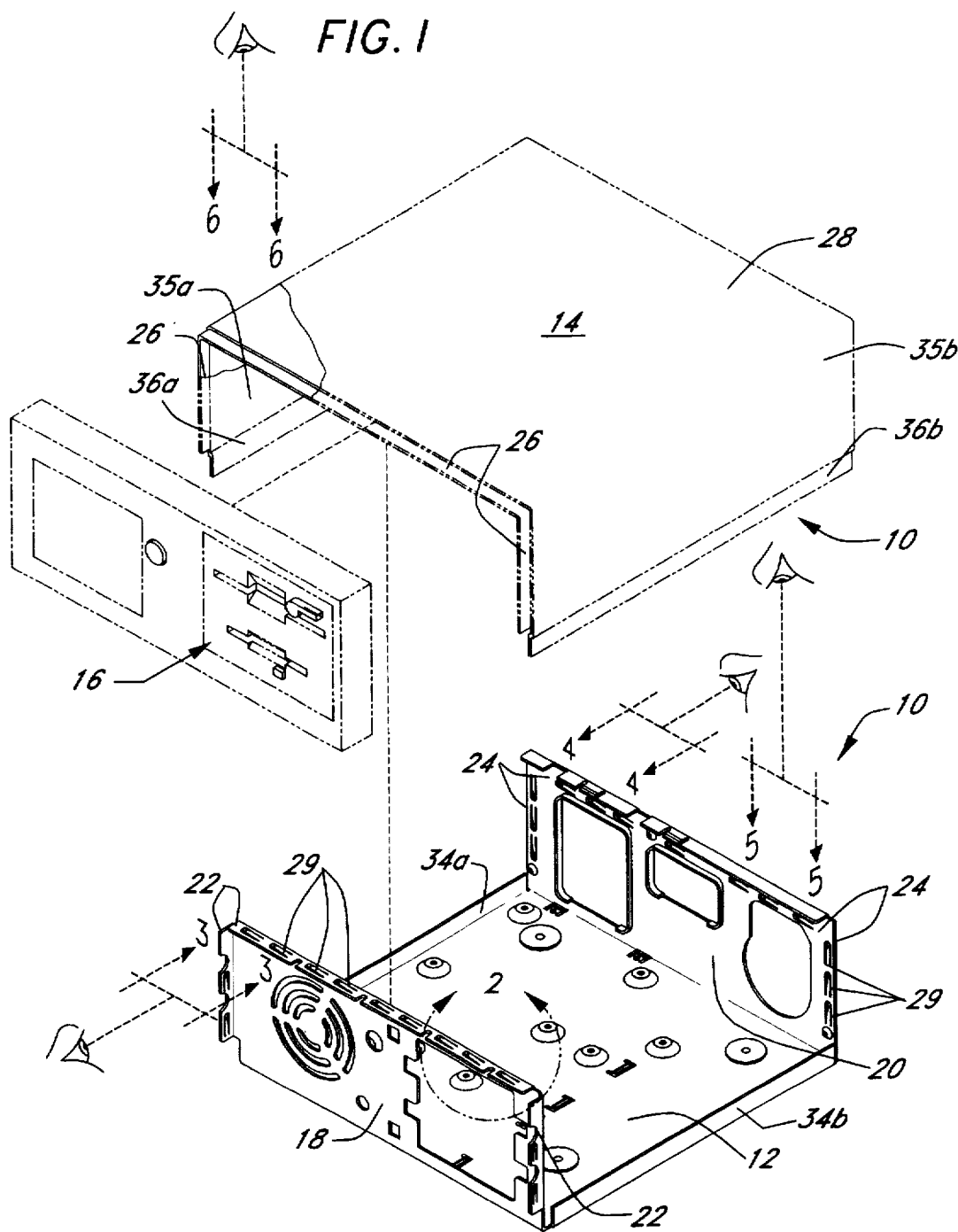
FIG. 1 is an exploded perspective view of a computer system chassis comprising a base and a mating cover.
Figure 4:
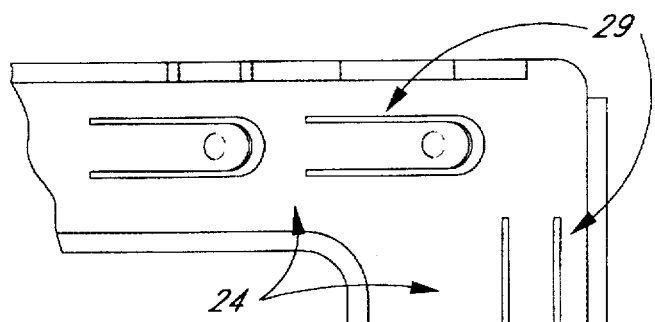
FIG. 4 is a partial rear view of a rear face of the base.

FIG. 1 is an exploded perspective view of a computer system chassis 10 comprising a base 12 and a mating cover 14. Most computer systems usually include a front bezel 16 as well. In a preferred embodiment, the base 12 comprises a front face 18 and a rear face 20. The front face 18 comprises a front base perimeter of contact region 22. This region 22 comprises a plurality of flexible contacts 29, and, as seen in FIGS. 2 and 3, each contact 29 comprises a protrusion arm 30 having a dimple 32. The rear face 20 comprises a rear base perimeter of contact region 24. This region 24 comprises a plurality of flexible contacts 29, and, as seen in FIG. 4 and 5, each contact 29 comprises a protrusion arm 30 having a dimple 32. The base 12 also has a left side edge 34a and a right side edge 34b, which typically comprises a rail (not shown) for mating with and guiding a corresponding rail (not shown) on the cover 14.

Although a stand-up tower type chassis may differ slightly in configuration, it is to be understood that a person of ordinary skill in the art will be able to apply the concepts disclosed herein to such variations in configuration. For example, in a tower type chassis, a base may comprise a major portion of the chassis, with a cover merely being a removable side, top, or rear panel. If contact regions between the base and removable panel are susceptible to forming gaps, then the teachings of the present invention are desirable in, and easily adaptable to, such a configuration.

The cover 14 comprises a front cover perimeter of contact region 26 and a rear cover perimeter of contact region 28 (which extends inward from the top and sides of the cover toward the center of the rear, in order to provide a region for contacting with the rear base perimeter of contact region 24, but is not shown in FIG. 1), as well as a left side 35a having a left side edge 36a and a right side 35b having a right side edge 36b. The cover 14 also typically comprises side rails (not shown) along the left and right side edges 36a and 36b for mating with and being guided onto the base 12.

The various "perimeter of contact regions" (e.g. regions 22, 24, 26, and 28 as are shown in FIG. 1) are defined as regions between the base 12 and cover 14 which are designed to contact each other to form a flush contact between the base 12 and cover 14, but do not always do so. These regions sometimes form gaps due to warped bases 12 or covers 14 or other various factors relating to design tolerances. On the base 12, these regions are the localized regions to which prior art add-on contacts were typically attached. These regions typically run along the left, right, and upper perimeter of the front and rear faces 18 and 20 of the computer system chassis 10 base 12. On the cover 14, these regions typically run along the left, right, and upper perimeter of the front and rear edges of the cover 14, as indicated by the labels 26 and 28, which define the front cover perimeter of contact region 26 and the rear cover perimeter of contact region 28.

It is known in the prior art that attaching the cover 14 of the computer system chassis 10 to the base 12 may result in some gaps forming between the front base perimeter of contact region 22 and the front cover perimeter of contact region 26, as well as between the rear base perimeter of contact region 24 and the rear cover perimeter of contact region 28. These gaps, contribute to leakage from the computer system chassis 10 of EMI emissions generated by a computer's processor and internal circuitry (not shown). EMI emissions also occur as a result of improper grounding of the cover 14 resulting from poor contact between the cover 14 and the base 12. A prior art solution has been to attach one or more contacts in these localized areas where gaps are formed.

Figure 7A:
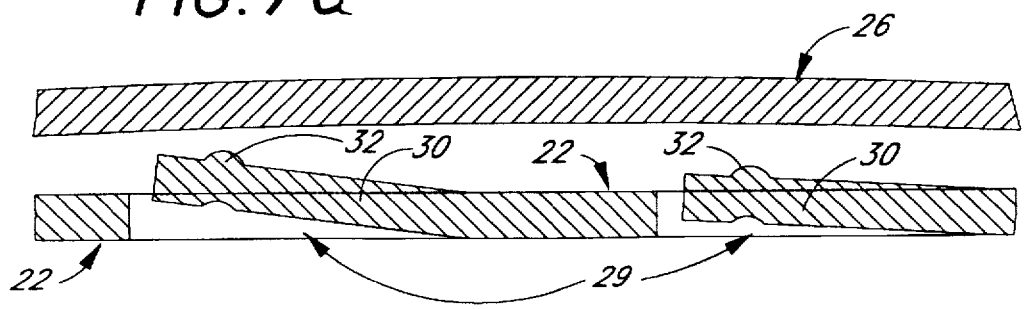
FIG. 7a is a side cutaway view of FIG. 6 shown prior to attaching the cover to the base.
Figure 7B:
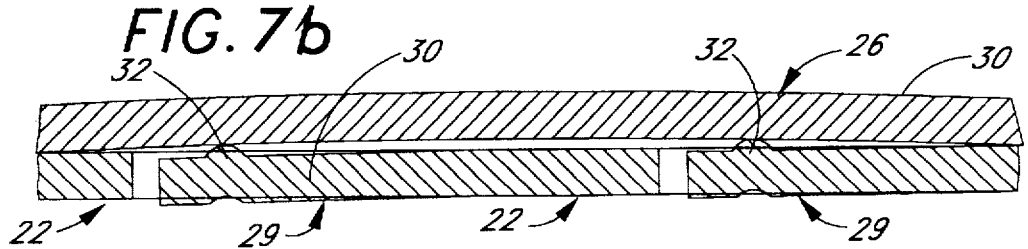
FIG. 7b is a side cutaway view of FIG. 6 shown after the cover is attached to the base. This figure illustrates the benefits of having flexible contacts, which increase the likelihood of contact between the cover and the base in contact regions where gaps may form.

For example, if a certain region of one of the perimeter of contact region areas is slightly warped, then the contact in that region between the base 12 and the cover 14 will not sit flush, and gaps will form (as shown in FIG. 7b). By manually placing an add-on contact into this localized region, the size of the gap can be reduced, thereby reducing the leakage of EMI emissions resulting from that gap.

The computer system chassis 10 of the present invention comprises a plurality of flexible contacts 29 which are comprised of protrusion arms 30 having dimples 32. The flexible contacts 29 are manufactured integrally into the chassis 10 so that add-on contact parts (not shown) do not have to be used, and so that manual labor to install these add-on protrusion parts is not required. By manufacturing the chassis 10 with a plurality of flexible contacts 29 integral to the chassis 10, potential gaps formed by contact regions that do not sit flush are reduced in size, thereby reducing leakage of EMI emissions generated by the computer's processor and internal circuitry (not shown). In a preferred embodiment, the flexible contacts 29 are formed integral to the base 12, although the contacts 29 could just as easily have been formed on the cover 14 or both the base 12 and the cover 14.

FIG. 2 is an enlarged view showing more detail of a few of the flexible contacts 29. In FIG. 2, a portion of the front base perimeter of contact region 22 is shown. This region 22 comprises integrally formed flexible contacts 29 which comprise protrusion arms 30 having dimples 32. The dimples 32 act as the contact point between the base 12 and the cover 14. The flexible contacts 29 are formed during the manufacturing process by taking a base blank (not shown) and punching out portions of the base blank so as to form the protrusion arms 30. The dimples 32 are added to the protrusion arms 30 during this process as well. It is to be understood that the flexible contacts 29 can be formed using a molding process as well.

Each flexible contact 29 is then slightly offset and raised from the plane of the surface from which it was punched out. The flexible contact 30 protrudes from the surface level of the front base perimeter of contact region 22, and in a preferred embodiment, the contacts 29 remain flexible after this process. By remaining flexible, the contacts 29 ensure that most, if not all, of the contacts 29 will make contact with the cover 14. If stiff contacts 29 are used, an individual contact 29 that protrudes the furthest would stop the cover 14 from coming closer to the base 12, thereby preventing contacts 29 which protrude less from making contact. In other words, flexibility is important in case certain contacts 29 protrude more than others. By flexing, all contacts 29 are capable of making contact with a corresponding contact point on the cover 14.

FIG. 3 is a front view of a portion of the front base perimeter of contact region 22. This view better illustrates the raised offset of the flexible contacts 29 above the plane of the sheet metal from which it was punched out.

FIG. 4 is a rear view of a portion of the rear base perimeter of contact region 24, which illustrates the plurality of flexible contacts 29 formed onto the rear face 20.

FIG. 5 is a top view looking down on a portion of the rear face 20, which illustrates the raised offset of the flexible contacts 29 above the plane of the sheet metal from which it was punched out.

When referring to an offset "above" the plane, the direction of "above" is meant to describe a direction toward the corresponding mating component. In a preferred embodiment, the flexible contacts 29 may be raised out of the base 12 toward the cover 14. If the contacts 29 were punched out of the cover 14 instead, then the raised offset would be in the direction of the base 12. In such an alternative configuration, the term "above" would be in the opposite direction from that described for the preferred embodiment.

However, if the manufacturing tolerances are small enough, then the contacts 29 may be formed in a plane parallel to the plane of the sheet metal from which is was punched out, since the raised dimples 32 will protrude a sufficient amount to extend across any slim gaps that may form in a chassis with small design tolerances.

Figure 6:
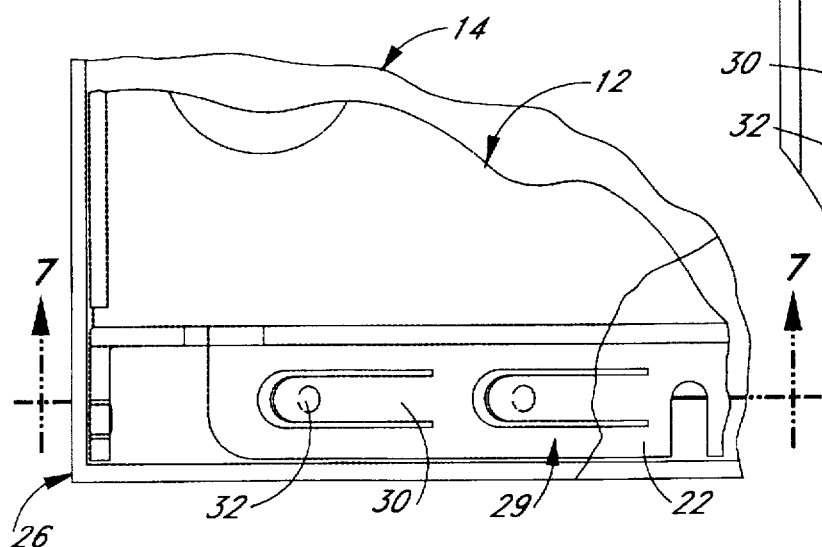
FIG. 6 is a partial top phantom view of a front cover perimeter of contact region and a front base perimeter of contact region.

FIG. 6 is a partial phantom view of the front base perimeter of contact region 22 shown in contact with the front cover perimeter of contact region 26. The phantom view shows the flexible contacts 29 of the base 12 making contact with the front cover perimeter of contact region 26.

FIGS. 7a and FIG. 7b show a side cutaway view of the front cover perimeter of contact region 26 coming into contact with the front base perimeter of contact region's 22 flexible contacts 29. Gaps typically are created when the cover 14 and base 12 do not sit flush, such as when one or the other is warped. Without the placement of flexible contacts 29 throughout the contact regions, large gaps may form where the contact regions do not sit flush. By integrally forming flexible contacts 29 into the base 12 contact region 22, even if the base 12 and cover 14 do not sit flush in these contact regions, the flexible contacts 29 extend across the gaps to form a contact with the cover 14, thereby reducing the size of the gap, which in turn reduces the leakage of EMI emissions through the gap. It is also understood by people of ordinary skill in the art that EMI emissions are reduced by improving the grounding of the cover 14 to the base 12, which is properly grounded via a power cord. Proper grounding is achieved by increasing metal-to-metal contact between the cover 14 and the base 12, and the contacts 29 of the present invention provide this function. By utilizing contacts 29 that are flexible, the probability of each flexible contact 29 making contact with the cover 14 across a formed 'gap is increased, since higher protruding contacts 29 will flex downward and will not prevent lower protruding contacts 29 from making contact.

While the above description contains many specificities, these should not be construed as limitations on the scope of the invention, but rather as an exemplification of preferred embodiments thereof. Many other variations are possible. For example, the flexible contacts 29 can be formed on the sides of the cover 14 and base 12, or on the front and rear of the cover 14, or on both the base 12 and the cover 14. In addition, flexible contacts 29 can be integrally formed into a computer system chassis for stand-up tower type configurations as well, by integrally forming flexible contacts 29 along the perimeter of contact regions between the base and cover of the tower chassis.

What is claimed is:

1. A chassis for housing electronic devises, said housing comprising:

a base formed from a base material, a cover formed from a cover material, said cover configured to attach to said base, with certain cover regions contacting certain base regions, and wherein said contact between said base and said cover is less than continuous, and a plurality of flexible contacts integrally formed from the material of at least one of said base regions and said cover regions and shaped to contact the other of said base regions and said cover regions, said flexible contacts improving electrical contact between said base regions and said cover regions and reducing the size of any gaps that form between the cover regions and base regions, and said flexible contacts having sufficient flexibility to enable more than one contact to contact said other region.

2. The chassis of claim 1, wherein said improved contact between said base regions and said cover regions is an electrical contact for improving electrical grounding of said cover.

3. The chassis of claim 1, wherein said improved contact between said base regions and said cover regions is a mechanical contact for reducing the size of potential gaps.

4. The chassis of claim 1, wherein said flexible contacts are integrally formed into said base during manufacturing of a base blank.

5. The chassis of claim 1, wherein said electronic devices comprise a computer system.

6. The chassis of claim 1, wherein said chassis is a computer system chassis used for housing a computer system comprising a microprocessor.

7. The chassis of claim 1, wherein said flexible contacts comprise a section of a base blank around which a portion of the base blank is punched out.

8. The chassis of claim 7, wherein said flexible contacts are parallel to said portions of said base blank from which said flexible contacts are formed.

9. The chassis of claim 7, wherein said flexible contacts protrude from the plane of said base blank from which said flexible contacts are formed.

10. The chassis of claim 1, wherein said flexible contacts comprise molded portions of a base blank.

11. The chassis of claim 10, wherein said flexible contacts comprise portions of said base blank formed in a plane parallel to the plane of the base blank.

12. The chassis of claim 10, wherein said flexible contacts protrude from the plane of said base blank from which said flexible contacts are formed.

13. The chassis of claim 1, wherein each of said plurality of flexible contacts comprises a protrusion arm formed by punching out portions of a base blank.

14. The chassis of claim 1, wherein said flexible contact has an outwardly arcing dimple extending outward in the same direction as the flexible contact.

15. A chassis for housing electronic device, said chassis comprising:

a base formed from an electrically conductive material, a cover formed from an electrically conductive material, said base having predetermined base regions of intended contact with said cover when said base and said cover are mutually attached, said cover having predetermined cover regions of intended contact with said base when said base and said cover are mutually attached, and a plurality of flexible contacts integrally formed from said electrically conductive material of at least one of said base regions and said cover regions and shaped to contact the other of said base regions and said cover regions, said flexible contacts reducing the size of gaps which form between said base regions and said cover regions wherein said flexible contacts extend across said gaps, said contact thereby increasing contact between said base and said cover and reducing the size of said gaps, said flexible contacts having sufficient flexibility to enable more than one contact to contact said other region.

16. A chassis for housing electronic devices comprising:

a base section;

a cover section, said cover section attaching to said base section such that at least a plurality of cover section regions contact a plurality of base section regions; and a plurality of flexible contacts homogeneously formed from at least one of said base section and said cover section, wherein each of said flexible contacts is separated from said at least one of said base section and said cover section by a slot so that said flexible contact may move outwardly from said at least one of said base section and said cover section to contact the other of said base section and said cover section to provide an electrical connection therebetween to provide continuity between EMF shielding provided by said base section and EMF shielding provided by said cover section.

17. A chassis as defined in claim 16, wherein said flexible contact has a protrusion partially traversing the width of the flexible contact, said protrusion further enhancing contact between said flexible contact and the other of said base section and said cover section.

18. The chassis as defined in claim 16, wherein said flexible contact is generally flat and biased outward from said one of said base section and said cover section toward the other of said base section and said cover section by a single bend, said single bend located where said flexible contact breaks the general plane of said one of said base section and said cover section from which said flexible contact is integrally formed.

19. A chassis for housing electronic devices comprising:

a base;

a cover;

a plurality of flexible contacts formed as part of an original material from which at least one of said base and said cover portion is formed; and a first end of each contact being a continuum of said original material, and a second end of each contact moving with respect to said cover portion, each said contact flexing between said respective first end and said respective second end.

* * * * *

UNITED STATES PATENT AND TRADEMARK OFFICE
CERTIFICATE OF CORRECTION

PATENT NO.    : 5,777,854
DATED         : July 7, 1998
INVENTOR(S)   : Randall S. Welch et al.

It is certified that error appears in the above-identified patent and that said Letters Patent is hereby corrected as shown below:

<u>Title page, Item [54], and Column 1, line 1,</u>
In the Title, change "INTEGRATE" to -- INTEGRATED --.

Signed and Sealed this

Twenty-sixth Day of February, 2002

*Attest:*

JAMES E. ROGAN
*Attesting Officer*         *Director of the United States Patent and Trademark Office*

UNITED STATES PATENT AND TRADEMARK OFFICE
CERTIFICATE OF CORRECTION

PATENT NO. : 5,777,854
DATED : July 7, 1998
INVENTOR(S) : Welch et al.

It is certified that error appears in the above-identified patent and that said Letters Patent is hereby corrected as shown below:

Column 8,
Line 29, insert -- the other of at least one of said base portion and -- between "with respect to" and "said cover portion."

Signed and Sealed this

Third Day of May, 2005

JON W. DUDAS
*Director of the United States Patent and Trademark Office*